(12) United States Patent
Feng et al.

(10) Patent No.: US 11,170,980 B2
(45) Date of Patent: Nov. 9, 2021

(54) METHODS OF TREATING A SURFACE OF A POLYMER MATERIAL BY ATMOSPHERIC PRESSURE PLASMA

(71) Applicant: CORNING INCORPORATED, Corning, NY (US)

(72) Inventors: Jiangwei Feng, Painted Post, NY (US); Wageesha Senaratne, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/758,130

(22) PCT Filed: Oct. 23, 2018

(86) PCT No.: PCT/US2018/057023
§ 371 (c)(1),
(2) Date: Apr. 22, 2020

(87) PCT Pub. No.: WO2019/083949
PCT Pub. Date: May 2, 2019

(65) Prior Publication Data
US 2020/0343079 A1    Oct. 29, 2020

Related U.S. Application Data

(60) Provisional application No. 62/578,020, filed on Oct. 27, 2017.

(51) Int. Cl.
*H01J 37/32* (2006.01)
*C08J 7/12* (2006.01)

(52) U.S. Cl.
CPC ......... *H01J 37/32752* (2013.01); *C08J 7/123* (2013.01); *H01J 37/3244* (2013.01);
(Continued)

(58) Field of Classification Search
None
See application file for complete search history.

(56) References Cited

U.S. PATENT DOCUMENTS 5,456,972 A    10/1995  Roth et al.
6,165,566 A    12/2000  Tropsha
(Continued)

FOREIGN PATENT DOCUMENTS

CN    103483610 A    1/2014
EP      1807548 A2    7/2007
(Continued)

OTHER PUBLICATIONS

Barreto et al., "Reduction of Plasticizer Leaching From Pvc by Barrier Coatings Deposited Using Dbd Processes at Atmospheric Pressure", Plasma Processes and Polymers, vol. 9, No. 11-12, 2012, pp. 1208-1214.
(Continued)

*Primary Examiner* — Roberts P Culbert
(74) *Attorney, Agent, or Firm* — F. Brock Riggs

(57) ABSTRACT

A method for treating a flexible plastic substrate is provided herein. The method includes establishing an atmospheric pressure plasma beam from an inert gas using a power of greater than about 90W, directing the plasma beam toward a surface of the flexible polymer substrate, and scanning the plasma beam across the surface of the polymer substrate to form a treated substrate surface.

16 Claims, 5 Drawing Sheets

(52) U.S. Cl.
CPC ..... *H01J 37/32825* (2013.01); *C08J 2323/06* (2013.01); *H01J 2237/3382* (2013.01)

(56) References Cited

U.S. PATENT DOCUMENTS

| | | | |
|---|---|---|---|
| 10,427,974 B2 | 10/2019 | Annamalai | |
| 2013/0022752 A1 | 1/2013 | Antonakas | |
| 2013/0302894 A1* | 11/2013 | Bekele | B32B 27/30 |
| | | | 435/394 |
| 2020/0165162 A1 | 5/2020 | Bellman et al. | |

FOREIGN PATENT DOCUMENTS

| | | |
|---|---|---|
| JP | 2003-062451 A | 3/2003 |
| WO | 2006/049794 A2 | 5/2006 |
| WO | 2006/064641 A1 | 6/2006 |

OTHER PUBLICATIONS

Chang et al., "Effects of Electric Discharge Surface Treatment on the Diffusion Characteristics of Polymers", Journal of Applied Polymer Science (John Wiley & Sons, Inc.), vol. 17, Issue No. 9, 1973, pp. 2915-2918.

Chu et al., "Plasma-Surface Modification of Biomaterials", A Review Journal, Materials Science and Engineering, R 36, 2002, pp. 143-206.

D.Bestwick, R. Colton. BioProcess International. v7, i2,2009.

Friedrich et al., "Plasma-Based Introduction of Monosort Functional Groups of Different Type and Density Onto Polymer Surfaces. Part 1: Behaviour of Polymers Exposed to Oxygen Plasma", Composite Interfaces, vol. 10, No. 2-3, 2003, pp. 139-171.

Guschl et al., "Atmospheric Oxygen-Helium Plasma Surface Modification of Medical Plastics," 2008 IEEE 35th International Conference on Plasma Science, Karlsruhe, 2008, pp. 1-1.

Hammond et al., "Identification of a Leachable Compound Detrimental to Cell Growth in Single-Use Bioprocess Containers", PDA J Pharm Sci and Tech, vol. 67, 2013, pp. 123-134.

Hansen et al., "A New Technique for Preparing Low Surface Energy Polymers for Adhesive Bonding", Journal of Polymer Science Part B: Polymer Letters, vol. 4, No. 3, 1966, pp. 203-209.

Huang C et al: "Contact angle analysis of low-temperature cyclonic atmospheric pressure plasma modified polyethylene terephthalate", Thin Solid Films, Elsvier, Amsterdam, NL, vol. 518, No. 13, Apr. 30, 2010, pp. 3575-3580.

International Search Report and Written Opinion of the International Searching Authority; PCT/US2018/057023; dated Jan. 23, 2020; 19 Pages; European Patent Office.

Jenke, Dennis, "Extractable/leachable Substances From Plastic Materials Used as Pharmaceutical Product Containers/devices", PDA Journal of Pharmaceutical Science and Technology, 2002, vol. 56, No. 6, pp. 332-371.

M J Shenton et al: "Surface modification of polymer surfaces: atmospheric plasma versus vacuum plasma treatments", Journal of Physics D: Applied Physics, Sep. 21, 2001, pp. 2761-2768.

M.Hamond, L. Marghitoiu, H. Lee, L. Perez, G. Rogers and Y. Nashed-Samuel, etc., Biotechnology Process, v30, i2, 2014 p. 261.

N. Inagaki, Plasma surface modification and plasma polymerization, CRC press, 1996, p. 5.

Pandiyaraj et al., "Influence of Non-thermal Plasma Forming Gases on Improvement of Surface Properties of Low Density Polyethylene (LDPE)", vol. 307, 2014, pp. 109-119.

Sanchis et al., "Surface Modification of Low Density Polyethylene (LDPE) Film by Low Pressure O2 Plasma Treatment", European Polymer Journal, vol. 42, 2006, pp. 1558-1568.

Vrekhem et al., "Application of Atmospheric Pressure Plasma on Polyethylene for Increased Prosthesis Adhesion", Thin Solid Films, vol. 596, Dec. 2015, 31 pages (Manuscript).

* cited by examiner

METHODS OF TREATING A SURFACE OF A POLYMER MATERIAL BY ATMOSPHERIC PRESSURE PLASMA

RELATED APPLICATIONS

This is a national stage application under 35 U.S.C. § 371 of International Application No. PCT/US2018/057023, filed Oct. 23, 2018, which claims the benefit of priority of U.S. Provisional Application Ser. No. 62/578,020 filed on Oct. 27, 2017, the contents of which are relied upon and incorporated herein by reference in their entity as if fully set forth below.

FIELD

The present disclosure generally relates to treating a surface of a polymer material. In particular, the present disclosure relates to atmospheric pressure plasma treatment for surface modification of a polymer substrate.

BACKGROUND

Bags containing fluids under sterile conditions are used in the bioprocess industry for the formulation, storage, transfer and transport of fluid while maintaining sterile conditions. Similarly, bags used to hold blood, urine and other materials utilized for medical purposes preferably provide and maintain sterile conditions for said materials. The bags may be used for biological fluids such as serum, buffers, and ultra-pure water and also for growing cell cultures to obtain the valuable biopharmaceutical compounds produced by cells. Some of the characteristics of the bags to preserve the quality of the products contained within include biocompatability with the products, sterility, and non-pyrogenicity. The bags are typically disposed of after use and are recognized as efficient means to prepare and store sterile fluids. Generally, these disposable bags are flexible and made from compatible plastic that is sterilized by Gamma radiation.

Such bags typically include a single material or a laminate of materials folded or cut and sealed to provide a container or vessel to hold liquid medium and cells. The bags are generally flexible and disposable. But, while conventional flexible and disposable bags may be inexpensive and adaptable, such bags may contaminate, to some degree, biological material constituents processed therein via extractables and leachables from the polymers, particularly if the biological materials are caustic or if processing within the bags, or manufacture of the bags, is done at elevated temperatures, which may impact processing results if the biological materials are sensitive to polymeric extractables and leachables.

SUMMARY

According to embodiments of the present disclosure, a method for treating a flexible plastic substrate is provided. The method includes establishing an atmospheric pressure plasma beam from an inert gas using a power of greater than about 90 W, directing the plasma beam toward a surface of the flexible polymer substrate, and scanning the plasma beam over at least a portion of the surface of the polymer substrate to form a treated substrate surface.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The disclosure will be understood more clearly from the following description and from the accompanying figures, given purely by way of non-limiting example, in which.

DETAILED DESCRIPTION

Figure 1:
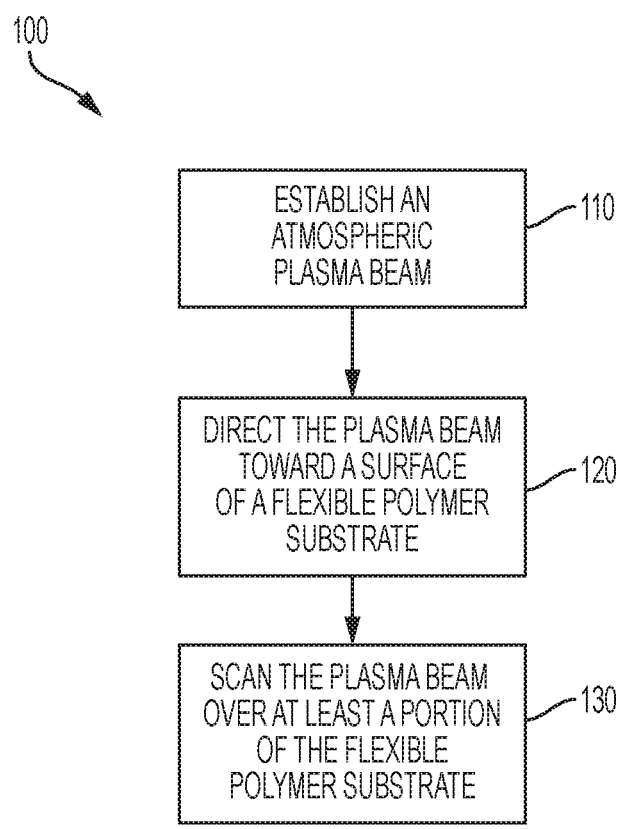
FIG. 1 is a flow chart illustrating a method for treating a surface of a polymer material in accordance with embodiments of the present disclosure.

Reference will now be made in detail to the present embodiment(s), an example(s) of which is/are illustrated in the accompanying drawings. Whenever possible, the same reference numerals will be used throughout the drawings to refer to the same or like parts.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

As used herein, "have," "having," "include," "including," "comprise," "comprising" or the like are used in their open-ended sense, and generally mean "including, but not limited to."

All scientific and technical terms used herein have meanings commonly used in the art unless otherwise specified. The definitions provided herein are to facilitate understanding of certain terms used frequently herein and are not meant to limit the scope of the present disclosure.

The present disclosure is described below, at first generally, then in detail on the basis of several exemplary embodiments. The features shown in combination with one another in the individual exemplary embodiments do not all have to be realized. In particular, individual features may also be omitted or combined in some other way with other features shown of the same exemplary embodiment or else of other exemplary embodiments.

Embodiments of the present disclosure relate to methods for treating the surface of a polymer substrate and to bioprocess bags including polymer materials having at least a portion of a surface treated in accordance with the present disclosure. Methods described herein include treating a polymer substrate surface with atmospheric pressure plasma to form a treated surface. As compared to an untreated polymer substrate surface the treated polymer substrate surface has a reduced overall concentration of extractable and leachable compounds. In particular, as compared to an untreated polymer substrate surface the treated polymer substrate surface has a reduced concentration of Bis(2,4-ditert-Butylphenyl) phosphate (bDtBPP). For example, treated polymer substrate surfaces formed in accordance with embodiments of the present disclosure exhibit a reduction of greater than about 70% total extractable and leachable content as compared to an untreated polymer substrate surface.

FIG. 1 depicts a flow chart for a method 100 for treating a surface of a polymer substrate in accordance with embodiments of the present disclosure. As described herein, the polymer substrate may be a film or laminate that includes at least one plastic material from the following group: polyethylene (PE), polypropylene (PP), polyvinyl chloride (PVC), polyethylene terephtalate (PET), polystyrene (PS), polycarbonate (PC), polymethylpentene (PMP), polyetheretherketone (PEEK) polytetrafluoroethylene (PTFE), polyethylene-co-vinyl acetate (EVA), polyfluoroalkoxy (PFA) and derivatives thereof. The film or laminate may have a low melting temperature and may also have high gas permeability.

According to embodiments of the present disclosure, the method 100 may include establishing 110 an atmospheric pressure plasma beam from an inert gas. As used herein, the term "atmospheric pressure plasma" includes a plasma formed from an inert gas under ambient pressure conditions, for example a pressure of about 1 atmosphere (atm), or at pressures ranging from about 0.1 atm to about 5 atm. Exemplary inert gasses include one or more of helium (He), neon (Ne), argon (Ar), krypton (Kr), xenon (Xe), and Radon (Rn), and optionally, hydrogen ($H_2$), nitrogen ($N_2$), or air and any combinations thereof at any desired ratios. The electrical power used to excite the plasma to form the atmospheric pressure plasma beam may be greater than about 90 W, for example between about 90 W and about 250 W, or between about 120 W and about 220 W, or even between about 140 W and about 200 W, and all values therebetween.

According to embodiments of the present disclosure, the method 100 may further include directing 120 the plasma beam toward a surface of the flexible polymer substrate to expose a portion of the surface of the flexible polymer substrate to the plasma beam.

According to embodiments of the present disclosure, the method 100 may further include scanning 130 the plasma beam over at least a portion of the surface of the flexible polymer substrate to form a treated substrate surface. Scanning 130 the plasma beam may include moving the plasma beam in relation to the flexible polymer substrate or moving the flexible polymer substrate in relation to the plasma beam. While the plasma beam may be moved over almost the entire surface area of the polymer substrate surface, the method may alternatively include moving the plasma beam over only a portion of the polymer substrate surface. For example, where the flexible polymer substrate is intended to be used to form a single use flexible bag, such as a bioprocess bag, the method may include moving the plasma beam over only the portions of the polymer substrate surface that will serve as the fluid contact layer of flexible bag. The plasma beam may not be moved over other portions of the polymer substrate surface, such as portions of the edges that may be welded to form the flexible bag. Optionally, scanning 130 the plasma beam may include moving the plasma beam over a first portion of the polymer substrate surface and then subsequently moving the plasma beam over a second portion of the polymer substrate surface.

As described herein, a single scan describes the movement of the plasma beam over a portion of the surface of the flexible polymer substrate. Subsequent movement of the plasma beam over the same portion of the surface of the flexible polymer substrate is described as a subsequent scan of the polymer substrate surface. According to embodiments of the present disclosure, scanning 130 the plasma beam over at least a portion of the surface of the flexible polymer substrate to form a treated substrate surface may include a plurality of scans over the same portion of the surface of the flexible polymer substrate. Scanning 130 the plasma beam over at least a portion of the surface of the flexible polymer substrate to form a treated substrate surface may include greater than about 10 scans, or greater than about 20 scans, or greater than about 30 scans, or greater than about 40 scans, or greater than about 50 scans, or greater than about 60 scans, or greater than about 70 scans, or greater than about 80 scans, or greater than about 90 scans, or even greater than about 100 scans. For example, scanning 130 the plasma beam over at least a portion of the surface of the flexible polymer substrate to form a treated substrate surface may include between about 10 scans and about 100 scans, or between about 20 scans and about 90 scans, or between about 30 scans and about 80 scans, or even between about 40 scans and about 70 scans.

In addition to the number of scans over the same portion of the surface of the flexible polymer substrate, the portion of the surface of the flexible polymer substrate may be exposed to the plasma beam for any period of time sufficient to form a treated substrate surface. The portion of the surface of the flexible polymer substrate may be exposed to the plasma beam for greater than about 0.5 seconds, for example, between about 0.5 seconds and about 5.0 minutes, or between about 1.0 second and about 3.0 minutes, or between about 3.0 seconds and about 1.0 minute, or even between about 5.0 seconds and about 30 seconds, and all values therebetween. It is recognized that the volume of flexible polymer substrate intended to be treated may define or limit the number of scans and the period of time the flexible polymer substrate may be exposed to the plasma beam. For example, where high volumes of flexible polymer substrate are intended to be treated, it may be advantageous to expose the flexible polymer substrate to the plasma beam for a relatively shorter period of time while limiting the number of scans over the same portion of the surface of the flexible polymer substrate.

Figure 2:
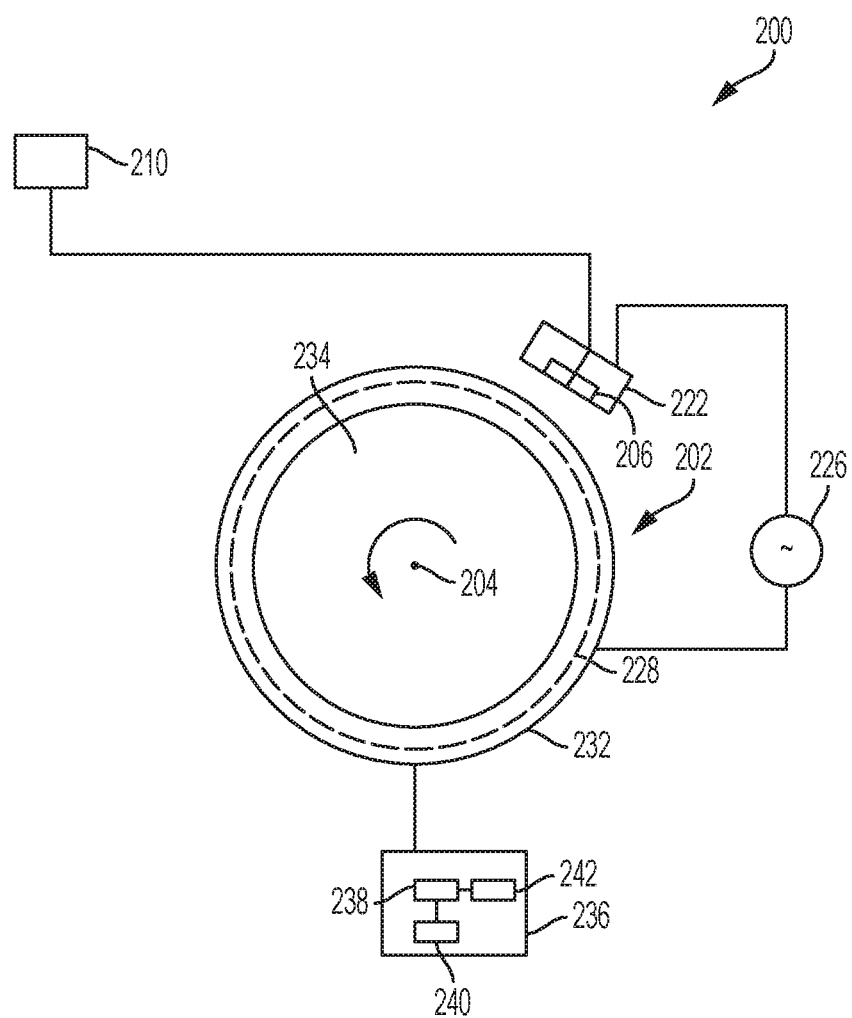
FIG. 2 illustrates an exemplary atmospheric pressure plasma apparatus in accordance with embodiments of the present disclosure.

FIG. 2 shows an atmospheric pressure plasma apparatus 200 in accordance with embodiments of the present disclosure. The apparatus 200 may be, for example, a dielectric barrier discharge (DBD) type plasma apparatus and generally includes a substrate support 202 and a plasma generator 222. The apparatus 200 may include a substrate support 202. The substrate support 202 may be any suitable support which positions the flexible polymer substrate such that the flexible polymer substrate can be exposed to the atmospheric pressure plasma beam. As an example, FIG. 2 includes a substrate support 202 that is rotatable about a central axis 204 such that a flexible polymer substrate present on the substrate support 202 passes under a plasma outlet 206 of the plasma generator 222. The apparatus 200 may include a distance between the substrate support 202 and the plasma generator 222 of greater than about 0.5 mm. For example, the distance between the substrate support 202 and the plasma generator 222 may be between about 0.5 mm and about 10 mm, or between about 1.0 mm and about 5.0 mm, or between about 1.5 mm and about 4.0 mm. Without wishing to be bound by any particular theory, it is believed that if the plasma generator 222 is placed a distance greater than about 10 mm from the substrate support 202 will prevent enough densification of the surface of the polymer film to form a treated substrate surface as described herein.

Figure 3:
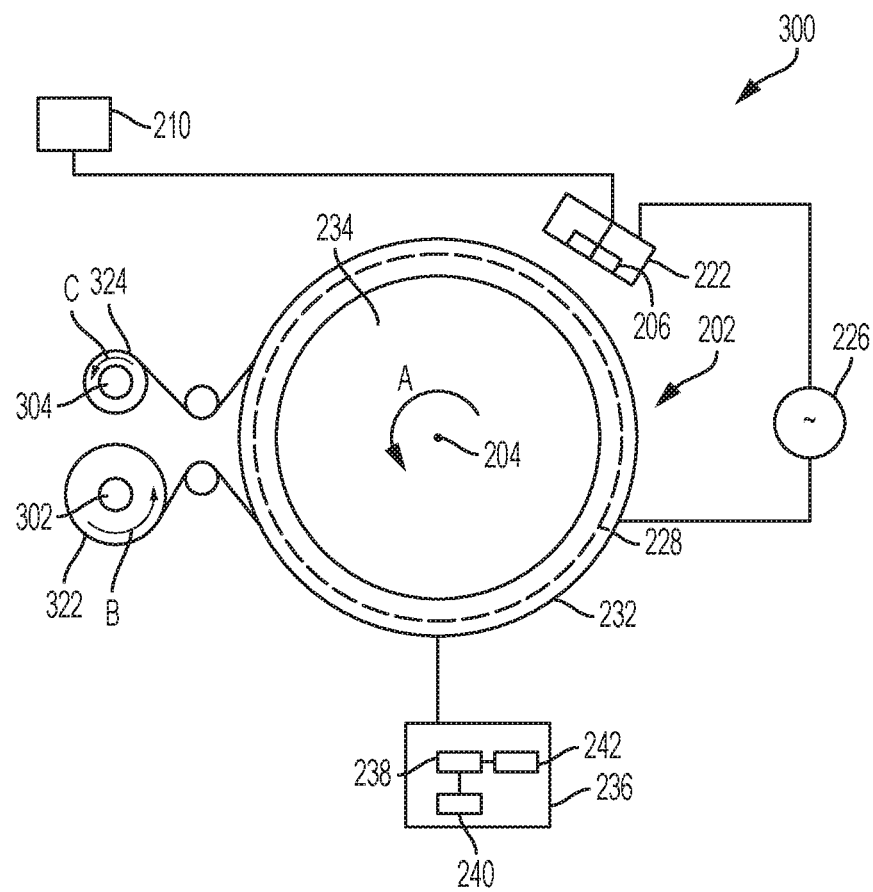
FIG. 3 illustrates an exemplary atmospheric pressure plasma apparatus in accordance with embodiments of the present disclosure.

FIGS. 2 and 3 show an atmospheric pressure plasma apparatus 200 including one plasma generator 222, however, it should be appreciated that atmospheric pressure plasma apparatuses 200 according to embodiments of the present disclosure may include any number of plasma generators. More than one plasma generator 222 may allow for increased exposure of the flexible polymer substrate to the atmospheric pressure plasma beam which may advantageously reduce the period of time sufficient to form a treated substrate surface. Alternative substrate supports 202 are also contemplated herein. For example, the apparatus 200 may include a conveyor belt (not shown) where the flexible polymer substrate moves on the conveyor belt past the plasma outlet 206 to expose a surface of the flexible polymer substrate to the atmospheric pressure plasma.

Optionally, as shown in FIG. 3, an atmospheric pressure plasma apparatus 300 in accordance with embodiments of the present disclosure may further include a first spool 302 and a second spool 304. In this optional configuration, the first spool 302 includes the flexible polymer substrate 322 wrapped on the spool. The substrate support 202 is rotationally driven in the direction indicated by arrow A in FIG. 3, the first spool 302 rotates in the direction indicated by Arrow B in FIG. 3, and the second spool 304 rotates in the direction indicated by Arrow C in FIG. 3. Thus, the flexible polymer substrate 322 is wound from first spool 302, around substrate support 202 and taken up on second spool 304 as a treated flexible polymer substrate 324. Rollers may be disposed between the substrate support 202 and each of the spools 302, 304 to facilitate movement of the flexible polymer substrate 322 or treated flexible polymer substrate 324 off of, or on to, the spools 302, 304. As shown in FIG. 3, the flexible polymer substrate 322 is wound around the substrate support 202 as the substrate support 202 rotates. The flexible polymer substrate 322 passes under a plasma outlet 206 of the plasma generator 222.

It is contemplated that other configurations of spools 302, 304 are possible. For example, the spools may be disposed on any side of the substrate support 202 and the substrate support 202 may rotate in any direction to facilitate plasma treatment of the flexible polymer substrate 322. Additionally, while the spools 302, 304 are illustrated in FIG. 3 as being on the same side of the substrate support 202, the first spool 302 may be disposed on a first side of the substrate support 202 and the second spool 304 may be disposed on a second side of the substrate support 202. Furthermore, with reference to FIG. 3, for purposes of clarity, the flexible polymer substrate is described as a flexible polymer substrate 322 prior to being passed under the plasma outlet 206 of the plasma generator 222 and as a treated flexible polymer substrate 324 after being passed under the plasma outlet 206 of the plasma generator 222. It should be appreciated that the flexible polymer substrate may be passed under the plasma outlet 206 of the plasma generator 222 more than once. In doing so the substrate support 202 may be rotationally driven in the direction opposite to the direction indicated by arrow A in FIG. 3, the first spool 302 may rotate in the direction opposite to the direction indicated by Arrow B in FIG. 3, and the second spool 304 may rotate in the direction opposite to the direction indicated by Arrow C in FIG. 3. Thus, the flexible polymer substrate 322 may further be wound from second spool 304, around substrate support 202 and taken up on first spool 302. The flexible polymer substrate 322 may be passed under the plasma outlet 206 of the plasma generator 222 any number of times.

The atmospheric pressure plasma apparatus 200, 300 may further include an inert gas source 210 fluidly connected to an electrode in the plasma generator 222 and configured to provide an inert gas to the electrode where plasma is formed from the gases. Gas exiting the gas source 210 is directed to the electrode in the plasma generator 222 where an atmospheric pressure plasma is formed. The atmospheric pressure plasma then passes from the electrode to the plasma outlet 206 where it exits the plasma generator 222. The electrode in the plasma generator 222 may be coupled to a power source 226. The power source 226 may be further coupled to a ground electrode 228 disposed in the substrate support 202. A capacitively coupled plasma may be formed between the electrode in the plasma generator 222 and the ground electrode 228. The power source may provide radio frequency (RF) or microwave frequency (MF) power. A dielectric layer 232 may be disposed between a substrate 234 and the ground electrode 228. Alternatively, (not shown) the dielectric layer may be a plurality of dielectric layers disposed between each the electrode 222 in the plasma generator 222 and the substrate 234. Such configuration is merely exemplary and it should be appreciated that other suitable configurations of a dielectric barrier discharge atmospheric pressure plasma apparatus may be utilized.

The atmospheric pressure plasma apparatus 200 may further include a controller 236 coupled to various components of the apparatus 200 and configured to control the operation of such components. Although schematically shown coupled to the substrate support 202, the controller may be operably connected to any of the components, and any number of the components, of the apparatus 200, in order to control the apparatus 200 in accordance with embodiments of the present disclosure. The controller 236 generally includes a central processing unit (CPU) 238, a memory 240, and support circuits 242 for the CPU 238. The controller 236 may control the apparatus 200 directly, or via other computers or controllers (not shown) associated with particular components of the apparatus 200. The controller 236 may be one of any form of general-purpose computer processor that can be used in an industrial setting for controlling various chambers and sub-processors.

The memory, or computer-readable medium 240 of the CPU 238 may be one or more of readily available memory such as random access memory (RAM), read only memory (ROM), floppy disk, hard disk, flash, or any other form of digital storage, local or remote. The support circuits 242 are coupled to the CPU 238 for supporting the processor in a conventional manner. These circuits include cache, power supplies, clock circuits, input/output circuitry and subsystems, and the like. Methods as described herein may be stored in the memory 240 as a software routine that may be executed or invoked to turn the controller into a specific purpose controller to control the operation of the apparatus 200 in accordance with embodiments described herein. The software routine may also be stored and/or executed by a second CPU (not shown) that is remotely located from the hardware being controlled by the CPU 238.

In operation, the substrate 200 may be placed on the substrate support 202 and rotated about the central axis 204. The plasma outlet 206 may provide the first process gas and the atmospheric pressure plasma may be formed by providing power from the power source 226 to the electrode of the plasma generator 222 and the ground electrode 228. The substrate 200 may be exposed to the atmospheric pressure plasma for any desired number of rotations about the central axis and/or any desired period of time.

The method for treating a surface of a polymer substrate as described herein may be performed using an atmospheric pressure plasma apparatus 200 such as the one shown in FIG. 2. As such, the flexible polymer substrate to be treated in accordance with the method described herein may be positioned on a substrate support 202. Additionally, scanning 130 the plasma beam over at least a portion of the surface of the flexible polymer substrate to form a treated substrate surface may include rotating the substrate support 202 about a central axis 204 such that the surface of the flexible polymer moves relative to the plasma outlet 206. Alternatively, the method for treating a surface of a polymer substrate as described herein may be performed using an atmospheric pressure plasma apparatus 300 such as the one shown in FIG. 3. As such, the flexible polymer substrate to be treated in accordance with the method described herein may be positioned on a first spool 302. Additionally, scanning 130 the plasma beam over at least a portion of the surface of the flexible polymer substrate to form a treated substrate surface may include rotating the first spool 302 and winding the polymer substrate from the first spool 302 and around the substrate support 202 such that the surface of the flexible polymer moves relative to the plasma outlet 206.

Additionally, in accordance with the method as described herein, establishing an atmospheric pressure plasma beam may include flowing an inert gas from an inert gas source 210 to an electrode of a plasma generator 222.

Figure 4:
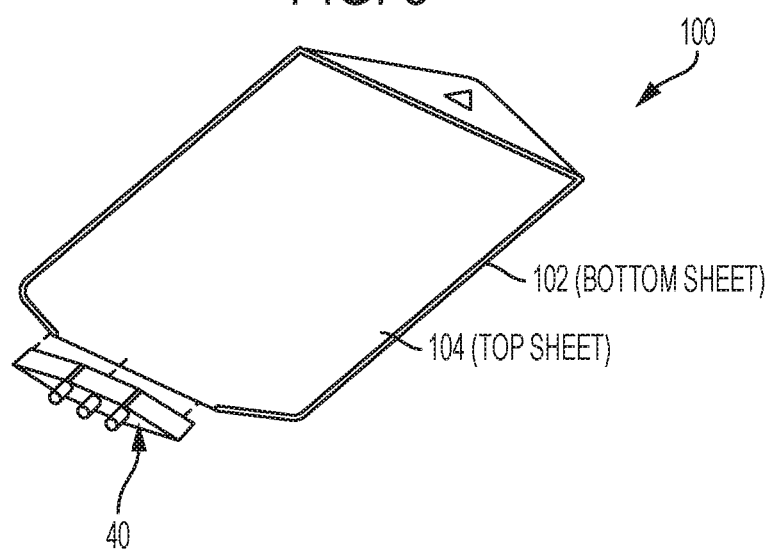
FIG. 4 illustrates an exploded view of an exemplary bioprocess bag in accordance with embodiments of the present disclosure.
Figure 5:
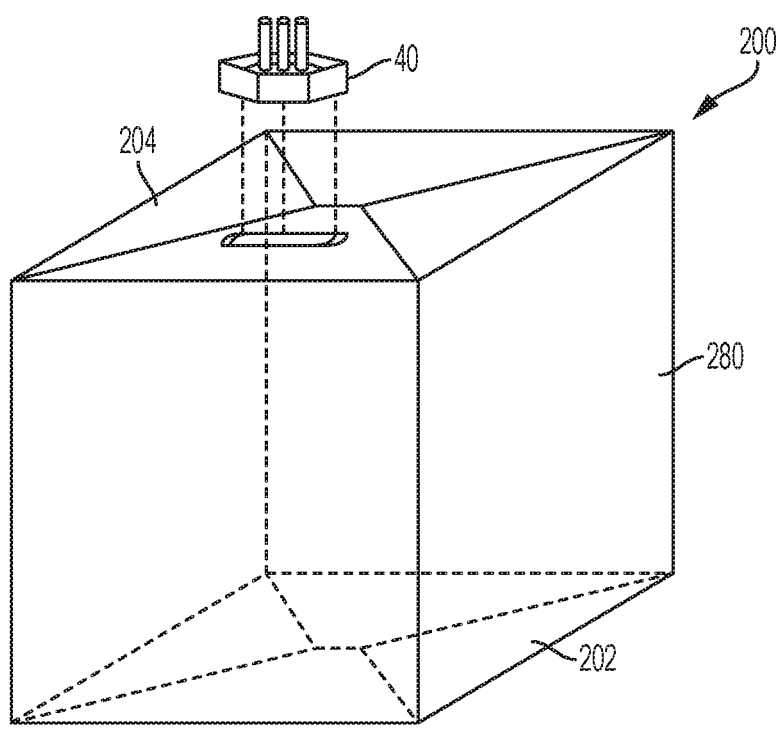
FIG. 5 illustrates an exploded view of an exemplary bioprocess bag in accordance with embodiments of the present disclosure.

FIG. 4 illustrates an exploded view of an exemplary bioprocess bag in accordance with embodiments of the present disclosure. As shown, the bioprocess bag 100 includes at least two sheets 102, 104 formed from films or laminates. The sheets 102, 104 may be welded along the edges of the sheets to form a pillow-shaped bag having an interior compartment for receiving fluid. Alternatively, as shown in FIG. 5, the bioprocess bag 200 may be a three-dimensional bag having a bottom portion 202, a top portion 204 and a sidewall 280 which define an interior compartment for receiving fluid. At least one of the bottom portion 202, the top portion 204 and the sidewall 280 is formed from a film or laminate. The sidewall 280 may be formed from a single continuous piece of material. Alternatively, the sidewall 280 may include two or more panels joined along edges thereof. The sidewall 280 and/or the bottom portion 202 and/or the top portion 204 may be formed from a single piece of material whereby boundaries of the various portions of the bioprocess bag 200 are defined by folds or creases. Alternatively, one or more of the sidewall 280, the bottom portion 202 and the top portion 204 may be formed separately and joined along edges thereof such as by welding the portions together. The bioprocess bag 100, 200 is hermetically sealed and preferably provides a closed system for use in all phases of processing fluid and/or other components. As used herein, the term "closed system" refers to a system sealed to ensure sterility of the contents of the system and to limit or prevent the introduction of contaminants from the surrounding atmosphere.

Each of the sheets 102, 104 of the bioprocess bag 100 may be formed from one or more of the same or different materials. Each of the top portion 204, the bottom portion 202 and the sidewall 280 of the bioprocess bag 200 may be formed from one or more of the same or different materials. Where opaque or colored materials are used, at least a portion of the bag may be substantially clear to allow for viewing of fluid and/or other components in the interior compartment of the bag. For example, a portion of any of sheets 102, 104 or at least a portion of any of top portion 204, bottom portion 202 and the sidewall 280 may be clear to provide a window through which the interior compartment of the bag can be viewed.

As used herein, the term "fluid" is used to denote any substance capable of flowing, such as liquids, liquid suspensions, gases, gaseous suspensions, or the like, without limitation. The term "fluid and/or other components" is used throughout the present disclosure to refer to fluid which may include cell culture media having nutrients for cell growth, cells, byproducts of the cell culture process, and any other biological materials or components that may conventionally be added or formed in a bioprocess system. Bioprocess bags and other vessels described herein may include one or more cells or reagents. Additionally, the bags may include cell culture media. Cell culture media may be for example, but is not limited to, sugars, salts, amino acids, serum (e.g., fetal bovine serum), antibiotics, growth factors, differentiation factors, colorant, or other desired factors. Common culture media that may be provided in the bag includes Dulbecco's Modified Eagle Medium (DMEM), Ham's F12 Nutrient Mixture, Minimum Essential Media (MEM), RPMI Medium, and the like. Any type of cultured cell may be included in the bag including, but not limited to, immortalized cells, primary culture cells, cancer cells, stem cells (e.g., embryonic or induced pluripotent), etc. The cells may be mammalian cells, avian cells, piscine cells, etc. The cells may be of any tissue type including, but not limited to, kidney, fibroblast, breast, skin, brain, ovary, lung, bone, nerve, muscle, cardiac, colorectal, pancreas, immune (e.g., B cell), blood, etc. The cells may be in any cultured form in the bag including disperse (e.g., freshly seeded), confluent, 2-dimensional, 3-dimensional, spheroid, etc. In some embodiments, cells are present without media (e.g., freeze-dried, in preservative, frozen, etc.).

The bioprocess bag 100, 200 may be formed from materials that are conventionally associated with disposable products for bioprocess applications. Any or all of the sheets 102, 104 of the bioprocess bag 100, or the bottom portion 202, top portion 204 and sidewall 280 of the bioprocess bag 200, may be formed from a film or laminate that includes at least one plastic material from the following group: polyethylene (PE), polypropylene (PP), polyvinyl chloride (PVC), polyethylene terephtalate (PET), polystyrene (PS), polycarbonate (PC), polymethylpentene (PMP), polyetheretherketone (PEEK) polytetrafluoroethylene (PTFE), polyfluoroalkoxy (PFA) and derivatives thereof.

It should be understood that the dimensions of the bioprocess bag 100, 200 including both relative and absolute dimensions can be varied. For example, the bags may be configured to hold a volume of fluid and/or other components of about 1.0 ml, or about 5.0 ml, or about 10 ml, or about 25 ml, or about 50 ml, or about 100 ml, or about or about 250 ml, or about 500 ml, or about 1000 ml, or about 2000 ml, or about 5000 ml, or about 10,000 ml, or even about 20,000 ml, as well as all volumes therein between.

Ultra high pressure liquid chromatography (UPLC) is a form of column chromatography used to separate, identify, and quantify compounds. UPLC allows for separation and analysis of small particles both quickly and effectively. Generally, liquid chromatography is the process of passing a mixture of particles to be separated through a column. This allows the analyte, which is separated from a mixture, to be measured from other molecules. The columns are filled with a packing material, known as the stationary phase. In UPLC a pump pushes the mixture, known as the mobile phase, through the columns. As the mobile phase passes through the stationary phase, a detector shows the retention times of the different molecules. Retention time varies depending on the interactions between the stationary phase, the molecules being analyzed, and the solvent used.

Figure 6:
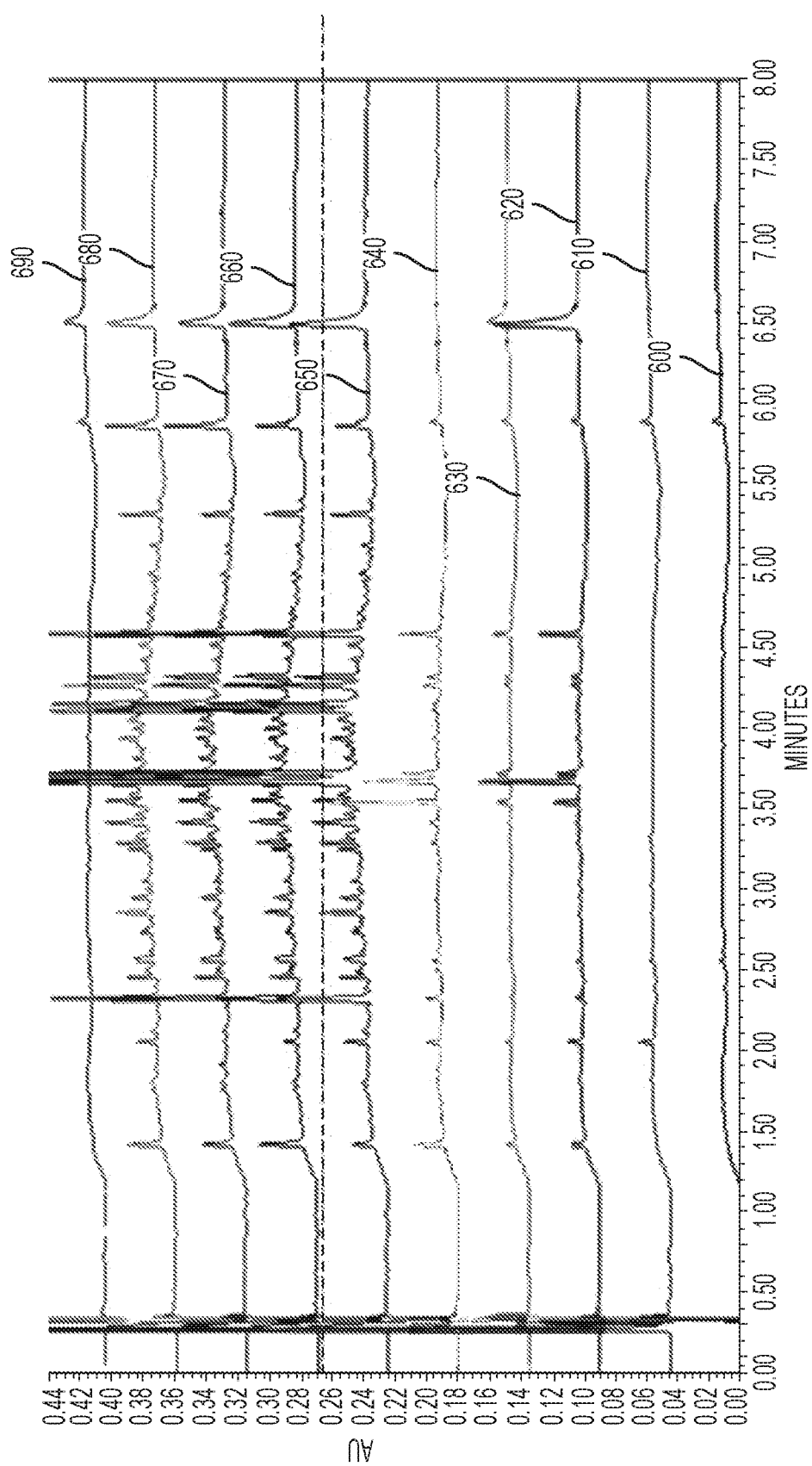
FIG. 6 shows timed wavelength chromatograms of Ultra Performance Liquid Chromatography (UPLC) for: a background reading; a glass sample; a Metallocene film treated with 20 scans of helium plasma at a power of 120 W; a Metallocene film treated with 40 scans of helium plasma at a power of 150 W; a Metallocene film treated with 80 scans of helium plasma at a power of 150 W; four separate 10 L Metallocene plastic bags; and a Bis(2,4-ditert-Butylphenyl) phosphate (bDtBPP) standard.

An Acquity UPLC H-Class System used with Waters Acquity UPLC Photo diode array detector using Cortecs C18 2.1×100 mm 2.7 μm Column (commercially available from Waters Corporation, Milford, Mass.) was utilized to analyze various films as described below. FIG. 6 shows timed wavelength chromatograms of UPLC for: a background reading 600; a glass sample 610; a Metallocene film 620 treated with 20 scans of helium plasma at a power of 120 W; a Metallocene film 630 treated with 40 scans of helium plasma at a power of 150 W; a Metallocene film 640 treated with 80 scans of helium plasma at a power of 150 W; four separate 10 L plastic bags 650, 660, 670, 680; and a Bis(2,4-ditert-Butylphenyl) phosphate (bDtBPP) standard 690. bDtBPP is an extractable compound which has been shown to be highly detrimental to cell growth. The compound is derived from the breakdown of tris(2,4-di-tert-butylphenyl)phosphite (trade name Irgafos 168®), a common antioxidant additive present in many formulations of polyethylene (one of the polymers commonly used as the material fluid contact layer in bioprocess containers such as flexible single use bioprocess bags). Cell growth experiments using several mammalian cell lines and growth media spiked with bDtBPP have shown harmful effects at concentrations well below the parts-per-million range. Cellular response to bDtBPP is rapid, and results in a significant decrease in mitochondrial membrane potential. The migration of bDtBPP from polyethylene-based films is shown to be time- and temperature-dependent. Further, experiments suggest that exposure of oxidized Irgafos 168 to ionizing radiation (such as gamma irradiation) is an important condition for the generation of significant amounts of leachable bDtBPP.

Each of Metallocene film 620, Metallocene film 630, and Metallocene film 640 were treated with an atmospheric pressure plasma beam formed with an excitation power of greater than 90 W. The inert gas used to form the plasma was helium with a gas flow rate of about 14.5 standard liter per minute (SLM). A high frequency plasma generator (13.56 MHz) was utilized in a continuous/non-filamentary mode. The plasma generator included a plasma outlet which was placed between about 2.0 mm and about 3.0 mm from the surface of a substrate support. The substrate support was a roller and each of the films was individually placed on the surface of the roller to be treated.

As can be seen from FIG. 6, each of the Metallocene films treated at 150 W exhibited a decrease in the concentration of bDtBPP as compared to the four separate 10 L plastic bag 650, 660, 670, 680. The Metallocene film 630 treated with 40 scans of helium plasma at a power of 150 W exhibited a decrease in the concentration of bDtBPP as compared to the four separate 10 L Metallocene plastic bag 650, 660, 670, 680. The Metallocene film 640 treated with 80 scans of helium plasma at a power of 150 W exhibited an even greater decrease in the concentration of bDtBPP as compared to the four separate 10 L Metallocene plastic bags 650, 660, 670, 680. The UPLC timed wavelength chromatogram for Metallocene film 640 resembled the UPLC timed wavelength chromatogram for the glass sample 610.

Because of its detrimental effects on cell growth, bDtBPP is the cited herein as showing important differences in comparing the UPLC timed wavelength chromatograms shown in FIG. 6. However, it should also be noted that many of the other extractable and leachable compounds exhibited by the four separate 10 L Metallocene plastic bag 650, 660, 670, 680 are also substantially reduced or eliminated in the films 620, 630, 640 treated in accordance with the present disclosure. In fact, the films 620, 630, 640 treated in accordance with the present disclosure exhibited a reduction of greater than about 70% total extractable and leachable content as compared to the four 10 L Metallocene plastic bags 650, 660, 670, 680. Thus, while embodiments of the present disclosure reduce the concentration of bDtBPP in polymer films, embodiments of the present disclosure also reduce the amount of other extractable and leachable compounds which may be harmful to the growth of at least some cells.

Without wishing to be bound by any particular theory, it is believed that helium plasma treatment in accordance with the present disclosure promotes cross-linking and densification of the surface of the polymer film which is intended to serve as the fluid contact layer of bioprocess bags formed from the polymer film. The helium plasma treatment is believed to reduce the presence of extractable and leachable compounds on the surface of the polymer film by removing low molecular weight species from the surface of the polymer film and by inducing crystallinity changes on the surface of the polymer film. Generally, due to the ionization energy created by the plasma treatment, more reactive species are generated. Such reactive species may promote crosslinking which drives out smaller molecules from the surface of the polymer and forms a relatively dense polymer surface. Such dense surface prevents the diffusion of oxygen which may result in the breakdown of TBPP.

While the present disclosure includes a limited number of embodiments, those skilled in the art, having benefit of this disclosure, will appreciate that other embodiments can be devised which do not depart from the scope of the present disclosure.

What is claimed is:

1. A method for treating a flexible polymer substrate used for forming a bioprocess bag, the method comprising:
   establishing an atmospheric pressure plasma beam from an inert gas using a power of greater than about 120 W;
   directing the plasma beam from a plasma outlet toward a surface of the flexible polymer substrate; and
   scanning the plasma beam over at least a portion of the surface of the polymer substrate to form a treated substrate surface,
   wherein the inert gas comprises helium, and
   wherein the treated polymer substrate surface comprises a total extractable and leachable content of less than about 70% of the total extractable and leachable content of an untreated polymer substrate surface.

2. The method of claim 1, wherein establishing the atmospheric pressure plasma beam comprises using a power of between about 120 W and about 220 W.

3. The method claim 1, wherein scanning the plasma beam over at least a portion of the surface of the polymer substrate comprises moving the plasma beam over a first portion of the polymer substrate surface and then subsequently moving the plasma beam over a second portion of the polymer substrate surface.

4. The method of claim 1, wherein scanning the plasma beam over at least a portion of the surface of the polymer substrate comprises moving the plasma beam in relation to the polymer substrate.

5. The method of claim 1, wherein scanning the plasma beam over at least a portion of the surface of the polymer substrate comprises moving the polymer substrate in relation to the plasma beam.

6. The method of claim 1, wherein directing the plasma beam toward a surface of the flexible polymer substrate comprises exposing the surface of the flexible polymer substrate to the plasma beam for greater than about 0.5 seconds, between about 0.5 seconds and about 5.0 minutes, between about 1.0 second and about 3.0 minutes, between about 3.0 seconds and about 1.0 minute, or between about 5.0 seconds and about 30 seconds.

7. The method of claim 1, wherein the flexible polymer substrate is positioned on a substrate support.

8. The method of claim 7, wherein the substrate support is rotatable about a central axis, and wherein scanning the plasma beam over at least a portion of the surface of the polymer substrate comprises rotating the substrate support about the central axis such that the surface of the flexible polymer moves relative to the plasma outlet.

9. The method of claim 1, wherein the flexible polymer is positioned on a spool.

10. The method of claim 9, wherein the spool is rotatable about a central axis, and wherein scanning the plasma beam over at least a portion of the surface of the polymer substrate comprises rotating the first spool and winding the polymer substrate from the first spool and around a substrate support such that the surface of the flexible polymer moves relative to the plasma outlet.

11. The method of claim 1, wherein establishing an atmospheric pressure plasma beam comprises flowing the inert gas from an inert gas source to an electrode of a plasma generator.

12. The method of claim 1, wherein scanning the plasma beam over at least a portion of the surface of the polymer substrate comprises greater than about 10 scans over the same portion of the surface of the polymer substrate, greater than about 40 scans over the same portion of the surface of the polymer substrate, greater than about 60 scans over the same portion of the surface of the polymer substrate, or greater than about 80 scans over the same portion of the surface of the polymer substrate.

13. The method of claim 1, wherein scanning the plasma beam over at least a portion of the surface of the polymer substrate comprises between about 20 scans and about 90 scans over the same portion of the surface of the polymer substrate.

14. A flexible polymer substrate treated by the method of claim 1.

15. A bioprocess bag comprising flexible polymer substrate of claim 14.

16. A bioprocess system configured for culturing cells, the bioprocess system comprising the flexible polymer substrate of claim 14.

* * * * *